(12) United States Patent
Doemer et al.

(10) Patent No.: US 9,496,116 B2
(45) Date of Patent: Nov. 15, 2016

(54) METHOD FOR MEASURING A DISTANCE OF A COMPONENT FROM AN OBJECT AND FOR SETTING A POSITION OF A COMPONENT IN A PARTICLE BEAM DEVICE

(71) Applicant: Carl Zeiss Microscopy GmbH, Jena (DE)

(72) Inventors: Holger Doemer, Bopfingen (DE); Andreas Schmaunz, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 14/874,969

(22) Filed: Oct. 5, 2015

(65) Prior Publication Data
US 2016/0118216 A1 Apr. 28, 2016

(30) Foreign Application Priority Data
Oct. 3, 2014 (DE) .......................... 10 2014 220 122

(51) Int. Cl.
*H01J 37/00* (2006.01)
*H01J 37/02* (2006.01)
*H01J 37/28* (2006.01)

(52) U.S. Cl.
CPC ............. *H01J 37/023* (2013.01); *H01J 37/28* (2013.01); *H01J 2237/006* (2013.01); *H01J 2237/10* (2013.01); *H01J 2237/2007* (2013.01); *H01J 2237/2801* (2013.01)

(58) Field of Classification Search
USPC .................... 250/306, 307; 850/1, 5, 6, 7
See application file for complete search history.

(56) References Cited

U.S. PATENT DOCUMENTS

| | | | |
|---|---|---|---|
| 2007/0069158 A1 | 3/2007 | Ohnishi | |
| 2008/0265158 A1 | 10/2008 | Iwasaki | |
| 2008/0302954 A1 | 12/2008 | Phaneuf et al. | |

FOREIGN PATENT DOCUMENTS

| | | |
|---|---|---|
| DE | 10 2008 016 645 A1 | 12/2008 |
| DE | 10 2010 046 902 A1 | 3/2012 |

*Primary Examiner* — Nicole Ippolito
*Assistant Examiner* — Hanway Chang
(74) *Attorney, Agent, or Firm* — Muirhead and Saturnelli, LLC

(57) ABSTRACT

The system described herein determines a distance of a component of a particle beam device from an object to the particle beam device and sets a position of the component in the particle beam device. The component is moved from a first starting position of the component relatively in the direction of an object, which is located in a second starting position, until the component makes contact with the object. When the component makes contact with the object, an adjusting path covered by the component and/or the object during the movement is determined. The adjusting path runs along a straight line that joins a first point on the component in the first starting position to a second point on the object in the second starting position that is arranged closest to the first point on the component along this line. The adjusting path corresponds to the distance.

21 Claims, 8 Drawing Sheets

METHOD FOR MEASURING A DISTANCE OF A COMPONENT FROM AN OBJECT AND FOR SETTING A POSITION OF A COMPONENT IN A PARTICLE BEAM DEVICE

TECHNICAL FIELD

The system described herein relates to a method for setting a position of at least one component of a particle beam device and to a particle beam device with which this method can be carried out. Furthermore, the system described herein relates to a method for measuring a distance of the component from the object.

BACKGROUND

Electron beam devices, in particular a scanning electron microscope (hereinafter also referred to as an SEM) and/or a transmission electron microscope (hereinafter also referred to as a TEM), are used for examining objects (specimens), in order to gain insights into the properties and behavior under certain conditions.

In the case of an SEM, an electron beam (hereinafter also referred to as a primary electron beam) is generated by means of a beam generator and focused by a beam guiding system onto an object to be examined. By means of a deflecting device, the primary electron beam is guided in the form of a raster over a surface of the object to be examined. The electrons of the primary electron beam thereby interact with the object to be examined. As a consequence of the interaction, in particular electrons are emitted from the object (known as secondary electrons) and electrons of the primary electron beam are backscattered (known as backscattered electrons). The secondary electrons and backscattered electrons are detected and used for image generation. An imaging of the object to be examined is thus obtained.

In the case of a TEM, a primary electron beam is likewise generated by means of a beam generator and focused by means of a beam guiding system onto an object to be examined. The primary electron beam radiates through the object to be examined. During the passage of the primary electron beam through the object to be examined, the electrons of the primary electron beam interact with the material of the object to be examined. The electrons passing through the object to be examined are imaged onto a luminescent screen or onto a detector (for example a camera) by a system consisting of an objective lens and a projection lens. The imaging may in this case also take place in the scanning mode of a TEM. Such a TEM is generally referred to as an STEM. In addition, it may be envisaged to detect electrons backscattered at the object to be examined and/or secondary electrons emitted by the object to be examined by means of a further detector, in order to image an object to be examined.

It is also known from the prior art to use combination devices for the examination of objects, devices in which both electrons and ions can be guided onto an object to be examined. For example, it is known to equip an SEM additionally with an ion beam column. An ion beam generator arranged in the ion beam column is used as a means for generating ions that are used for the preparation of an object (for example ablating material of the object or applying material to the object) or else for imaging. The SEM serves here in particular for observation of the preparation, but also for further examination of the prepared or unprepared object.

In a further known particle beam device, application of material to the object is performed for example by using the feeding of a gas. The known particle beam device is a combination device, which provides both an electron beam and an ion beam. The particle beam device has an electron beam column and an ion beam column. The electron beam column produces an electron beam, which is focused onto an object.

The object is arranged in a specimen chamber kept under a vacuum. The ion beam column produces an ion beam, which is likewise focused onto the object. By means of the ion beam, for example a layer of the surface of the object is removed. After removal of this layer, a further surface of the object is exposed. By means of a gas feeding device, a gaseous preliminary substance—known as a precursor—can be admitted into the specimen chamber. It is known to form the gas feeding device with a needle-shaped device, which can be arranged quite close, at a distance of a few μm, from a position of the object, so that the gaseous preliminary substance can be guided to this position as accurately as possible. By interaction of the ion beam with the gaseous preliminary substance, a layer of a substance is deposited on the surface of the object. For example, it is known to admit gaseous phenanthrene into the specimen chamber through the gas feeding device as the gaseous preliminary substance. Then it is substantially a layer of carbon or a carbon-containing layer that is deposited on the surface of the object. It is also known to use a gaseous preliminary substance that compries a metal, in order to deposit a metal on the surface of the object. However, the depositions are not restricted to carbon and/or metals. Rather, any desired substances may be deposited on the surface of the object, for example semiconductors, nonconductors or other compounds.

In order that sufficient carbon or metal can be deposited on the surface, it is desirable to arrange the needle-shaped device of the gas feeding device as close as possible to the position on the surface of the object at which the layer is to be deposited. It is accordingly desirable to position the needle-shaped device as well as possible and to align it with the desired position of the surface of the object. However, the accurate positioning of the needle-shaped device often presents problems. Up until now, there has not been any reproducible procedure by which the needle-shaped device can always be arranged exactly at a specific position on the surface of the object. The previously known methods are in essence based on the principle of "trial and error". Such a principle, however, is undesirable and disadvantageous. On the one hand, positioning the needle-shaped device at a specific position can take quite a long time. On the other hand, it is quite possible for errors to occur during the setting of the position, that is to say for there to be deviations from this position of the needle-shaped device, so that the needle-shaped device is not aligned sufficiently well with the position of the surface of the object. This can lead to a reduction in the gas density at the desired position of the surface of the object. This leads for example to a sparse and/or unreproducible deposition of a layer on the surface of the object.

Accordingly, it is desirable to be able to address the problem of providing a method and a particle beam device with which a component of a particle beam device, in particular a gas feeding device, can be positioned as accurately as possible at a specific position.

SUMMARY OF THE INVENTION

The system described herein is intended for determining a distance of a component of a particle beam device from an object, the object being arranged in the particle beam device and the object being analyzed and/or processed by the particle beam device. The distance is the distance of the component, which is located in a first starting position, from the object, which is located in a second starting position. The component is formed as a gas feeding device, as a particle detector, as a beam detector, as a manipulator for processing the object, as a holding device for holding the object, as a device for removing at least part of the object from the object, as a light beam source and/or as a particle beam source. The foregoing enumeration is not exhaustive however. Rather, the system described herein may be used for any component of the particle beam device that can be set in its position in relation to the object in the particle beam device.

The particle beam device comprises at least one beam generator for generating a particle beam with charged particles. Furthermore, the particle beam device is provided with at least one objective lens for focusing the particle beam onto the object and with at least one vacuum region, in which the aforementioned component is arranged. For example, the vacuum region is formed as a specimen chamber of the particle beam device and/or as part of a beam guiding tube of the particle beam device.

The method according to the system described herein for determining the aforementioned distance comprises moving the component from the first starting position of the component relatively in the direction of the object, which is located in the second starting position. In other words, the component is moved in the direction of the object and/or the object is moved in the direction of the component. The moving of the component in relation to the object is performed until the component makes contact with the object.

The manner in which the contacting of the component with the object is established may be suitably chosen as desired, it being possible here for properties of the object to be taken into account. For example, in the case of an electrically conducting component and an electrically conducting object, the contacting of the component with the object may be detected by a resistance measurement. In other words, the electrical resistance between the component and the object is measured. As soon as the object makes contact with the component, for example, the electrical resistance is reduced abruptly or stops completely. The measuring of the electrical resistance may for example be performed automatically and/or continuously, that is to say constantly.

In the case of another exemplary embodiment, the contacting may be established by visual observation. This exemplary embodiment is suitable in particular for non-conducting objects. In the case of this exemplary embodiment, it is provided that the object and the component are imaged by the particle beam device and that an image of the object and of the component is thereby generated. The image of the object and of the component is observed for example on a monitor of the particle beam device. When there is a movement of the component toward the object, the component moves in a first direction in the image. When the component makes contact with the object, a slight, reversible bending of the component is detectable. This bending can be detected by the fact that the component then moves in a second direction in the image, the second direction being different from the first direction. In the case of this exemplary embodiment, the approach of the component to the object is observable.

For example, the component generates what is known as a shadow on the object, which can be detected in the image of the particle beam device. This shadow is generated because interaction particles, which are generated when the particle beam impinges on the object by interaction with the object, reach a detector of the particle beam device, which is used for the imaging, less well, or not at all, as a result of the component being arranged in the path of the interaction particles. This is manifested in the image by a darker region (that is to say a shadow). When the component approaches the object, the distance of the shadow with respect to the component is reduced. Therefore, the approach of the component to the object can be observed by means of the distance of the shadow. In particular, it may be provided that the speed of the movement of the component is reduced when the distance of the shadow has become so small that contacting of the component with the object is imminent.

In the case of yet another embodiment, it is envisaged to move the object. For example, it is moved by an object holder on which the object is arranged being moved. If the component is already in contact with the object, then the component bends slightly and this bending is evident visually in the image by a movement of the component. In this case, the object and the component may move in different directions in the image. If the component is not yet in contact with the object, when there is a slight movement of the object there is not yet any visually evident movement of the component in the image.

When contacting of the component with the object is established, further moving of the component and/or the object is stopped. Furthermore, as soon as the component makes contact with the object, an adjusting path covered by the component and/or the object during the movement is determined, the adjusting path running along a straight line that joins a first point on the component in the first starting position to a second point on the object in the second starting position, the second point being arranged closest to the first point on the component along this line. The first point is located for example on a first surface of the component and the second point is located for example on a second surface of the object. The first surface and the second surface are directed toward one another at least partially, for example completely. The adjusting path corresponds to the distance between the component in the first starting position and the object in the second starting position.

The system described herein relates to a further method, to be specific a method for setting a position of at least one component of a particle beam device in relation to an object, the object being analyzed and/or processed by the particle beam device. In other words, the component is positioned with respect to the object. The component is formed as a gas feeding device, as a particle detector, as a beam detector, as a manipulator for processing the object, as a holding device for holding the object, as a device for removing at least part of the object from the object, as a light beam source and/or as a particle beam source. The foregoing enumeration is not exhaustive however. Rather, the system described herein may be used for any component of the particle beam device that can be set in its position in relation to the object in the particle beam device.

The particle beam device comprises at least one beam generator for generating a particle beam with charged particles. Furthermore, the particle beam device has at least one optical axis, along which the particle beam is guided. Furthermore, the particle beam device is provided with at least one objective lens for focusing the particle beam onto the object and with at least one vacuum region, in which the aforementioned component is arranged. For example, the vacuum region is formed as a specimen chamber of the particle beam device and/or as part of a beam guiding tube of the particle beam device.

In the case of the method according to the system described herein, a desired position of the component is set. This is a position that is particularly well-suited for achieving a desired effect. For a gas feeding device, this is for example the position in which a sufficiently good deposition of material onto a surface of the object can be achieved. For a particle detector, this is for example the position in which a particularly good detection of particles can be achieved. In the desired position, the component is at a first object distance from the object, the first object distance being given by the length of a first line, which is aligned parallel to the optical axis or perpendicularly to a normal to the surface of the object. Furthermore, the first line joins a first point on the component to a second point on the object, the second point being arranged closest to the first point on the component along the first line. The first point is located for example on a first surface of the component and the second point is located for example on a second surface of the object. The first surface and the second surface are directed toward one another at least partially, for example completely.

The method according to the system described herein also comprises determination of an actual position of the component.

It is accordingly determined in which position the component is in actual fact located. The determination of the actual position of the component is performed by determining a second object distance, which is the distance at which the component is from the object in the actual position. The determination of the second object distance thus comprises two steps. On the one hand, the component is moved from a first starting position relatively in the direction of the object, which is located in a second starting position. In other words, the component is moved from the first starting position in the direction of the object and/or the object is moved from the second starting position in the direction of the component. This is performed until the component makes contact with the object. The contacting of the object with the component is determined for example in the ways mentioned further above or below. As soon as the component makes contact with the object, on the other hand, an adjusting path covered by the component and/or the object during the movement is determined. The adjusting path runs along the first line. The adjusting path covered corresponds to the second object distance.

A comparison of the first object distance, which represents the desired position, with the second object distance of the actual position is performed. If the first object distance does not coincide with the second object distance, the component is then moved in relation to the object until the first object distance and the second object distance coincide. In other words, the actual position of the component is changed in relation to the object until the actual position corresponds to the desired position.

The system described herein is based in particular on the idea that the object distance between the object and the component can be determined easily and quickly by the contacting of the object with the component. It is then easily possible to change the actual position in such a way that the component can be brought into the desired position. This is for example a position that is particularly well-suited for achieving a desired effect. For a gas feeding device, this is for example the position in which a sufficiently good deposition of material onto a surface of the object can be achieved. For a particle detector, this is for example the position in which a particularly good detection of particles can be achieved.

In the case of one embodiment, it is additionally or alternatively envisaged to take an axis distance into account. Thus, in the case of this embodiment, the component in the desired position is at a first axis distance from the optical axis, the first axis distance being given by the length of a second line, which is aligned perpendicularly to the optical axis and joins a third point on the optical axis to a fourth point on the component, the fourth point being arranged closest to the third point on the optical axis. The fourth point is for example arranged on a surface of the component. In the actual position, the component is at a second axis distance, the second axis distance being given by the length of a third line, which is aligned perpendicularly to the optical axis and joins a fifth point on the optical axis to a sixth point on the component, the sixth point being arranged closest to the fifth point on the optical axis. For example, the sixth point is arranged on the surface of the component. The sixth point is for example identical to the fourth point. In the case of the embodiment of the system described herein, when setting the desired position of the component, setting of the first axis distance is also performed. Accordingly, the component in the desired position is to be at the first axis distance. Furthermore, it is provided in the case of this embodiment that the determination of the actual position of the component comprises a determination of the second axis distance. A comparison of the first axis distance with the second axis distance is performed. If the first axis distance does not correspond to the second axis distance, the moving of the component in relation to the object is performed until the first axis distance and the second axis distance coincide.

In the case of another embodiment of the method according to the system described herein, it is additionally or alternatively provided that the determination of the second axis distance of the component in relation to the optical axis is performed by the following steps. Firstly, the particle beam is guided over the object and onto the component. At the same time, interaction particles and/or interaction radiation is/are detected by at least one detector, the interaction particles and/or the interaction radiation being generated by an interaction of the particle beam with the object and/or the component. The detector generates detection signals, which are used to generate an image of the object and of the component. By using the image, the second axis distance is then measured. Accordingly, in the case of this embodiment it is envisaged to determine the second axis distance visually.

In the case of another embodiment of the method according to the system described herein, it is additionally or alternatively provided that the component is movably formed. Accordingly, the position of the component can be set. For example, the component is formed movably along at least one of the following axes, to be specific a first component axis, a second component axis and a third component axis, at least two of the aforementioned axes being aligned perpendicularly to one another. In the case of another embodiment, the component is for example formed rotatably about a first component rotation axis and/or about a second component rotation axis. The exemplary embodiment thus provides that the component is moved toward the object when the second object distance is determined. For example, the movement of the component is performed along a straight line that is aligned parallel to the optical axis of the particle beam device. In addition or as an alternative to this, it is envisaged to move the component along a straight line that is aligned parallel to a normal to the surface of the object.

In the case of yet another exemplary embodiment of the method according to the system described herein, it is additionally or alternatively provided that the particle beam device has at least one movable object carrier for receiving the object. For example, the object carrier is formed movably along at least one of the following axes, to be specific a first axis, a second axis and a third axis, at least two of the aforementioned axes being aligned perpendicularly to one another. For example, in the case of one embodiment it is provided that the object carrier is formed rotatably about a first rotation axis and/or about a second rotation axis. In the case of the exemplary embodiment described here, it is provided that the object carrier is moved toward the component. For example, the movement of the object carrier is performed along the optical axis of the particle beam device. In addition or as an alternative to this, it is envisaged to move the object carrier along the normal to the surface of the object.

To this extent, three different movements can be performed in the determination of the distance and/or second object distance, which have already been briefly explained above. On the one hand, the component may be moved toward the object. On the other hand, the object may be moved toward the component. In the case of yet another embodiment, both the component may be moved toward the object and the object may be moved toward the component by moving the object carrier.

The system described herein also relates to a further method, to be specific a method for processing and/or analyzing an object with a particle beam device. This method comprises on the one hand the setting of a position of a component of a particle beam device by a method that has at least one of the features mentioned above or below or a combination of at least two of the features mentioned above or below. Following that, processing and/or analyzing of the object is performed, the component then being located in the set position.

The system described herein also relates to a computer program product with a program code which has been loaded or can be loaded into a processor and which when executed controls a particle beam device in such a way that a method with at least one of the features mentioned above or mentioned further below or with a combination with at least two of the features mentioned above or further below is executed.

The system described herein also relates to a particle beam device for analyzing and/or processing an object that has at least one beam generator for generating a particle beam with charged particles. The particle beam device has at least one optical axis, along which the particle beam can be guided or is guided. Furthermore, the particle beam device is provided with at least one objective lens for focusing the particle beam onto the object. In addition, the particle beam device has at least one object carrier for arranging the object and at least one vacuum region, in which a component of the particle beam device is arranged. The vacuum region may for example be formed as a specimen chamber and/or as part of a beam guiding tube of the particle beam device. The component of the particle beam device is for example formed as a gas feeding device, as a particle detector, as a beam detector, as a manipulator for processing the object, as a holding device for the object, as a device for removing at least part of the object from the object, as a light beam source and/or as a particle beam source. The object carrier and/or the component are adjustably formed. The particle beam device has at least one processor, in which an aforementioned computer program product has been loaded.

In the case of one embodiment of the particle beam device according to the system described herein, it is additionally or alternatively provided that the object carrier is formed movably along at least one of the following axes, to be specific a first axis, a second axis and a third axis. For example, at least two of the aforementioned axes are aligned perpendicularly to one another. In particular, it is provided that all of the axes are aligned perpendicularly to one another.

In the case of yet another exemplary embodiment of the particle beam device according to the system described herein, it is provided additionally or as an alternative to this that the object carrier is formed rotatably about a first rotation axis and/or about a second rotation axis.

In the case of yet another embodiment of the particle beam device according to the system described herein, it is additionally or alternatively provided that the component is formed movably at least along one of the following axes, to be specific a first component axis, a second component axis and a third component axis. In particular, it is provided that at least two of the aforementioned axes are aligned perpendicularly to one another. In particular, it is provided that all of the component axes are respectively aligned perpendicularly to one another.

In the case of another embodiment of the particle beam device according to the system described herein, it is additionally or alternatively provided that the component is formed rotatably about a first component rotation axis and/or about a second component rotation axis.

In the case of yet another embodiment of the particle beam device according to the system described herein, it is additionally or alternatively provided that the beam generator is formed as a first beam generator and the particle beam is formed as a first particle beam with first charged particles, the optical axis being formed as a first optical axis, along which the first particle beam can be guided, and the objective lens being formed as a first objective lens for the focusing of the first particle beam onto the object. The particle beam device also has at least a second beam generator for generating a second particle beam with second charged particles, at least a second optical axis, along which the second particle beam can be guided, and at least a second objective lens for the focusing of the second particle beam onto the object.

In the case of yet another embodiment, it is provided that the particle beam device is formed as an electron beam device and/or as an ion beam device.

The system described herein also relates to a gas feeding device for feeding at least one gas to an object, which can be analyzed or can be processed in a particle beam device. For example, the particle beam device is the particle beam device already mentioned above and/or a particle beam device that is described further below. The gas feeding device has at least one gas inlet for letting at least one gas into the gas feeding device. Furthermore, the gas feeding device has at least one gas outlet for letting the gas out of the gas feeding device. In addition, the gas feeding device is provided with at least one receiving unit, on which the gas inlet and/or the gas outlet is/are arranged. A movably formed manipulator for the processing and/or arrangement of the object is arranged in the receiving unit.

The gas feeding device combines the advantages of a manipulator and a gas feeding device in a single component.

The gas is always fed to wherever it is desired. It is accordingly ensured that a sufficient amount of gas for allowing a deposition of material on the surface of the object is always available. At the same time, the manipulator can always be positioned sufficiently in such a way that it is arranged in the region of a location to be processed on the surface of the object.

In the case of the gas feeding device according to the system described herein, it is provided in particular that the manipulator within the receiving unit can for example be drawn forward and back and/or can for example be turned or laterally moved by means of a positioning device. The manipulator may also be moved and positioned in such a way that it is arranged in the receiving unit in a protected manner.

In the case of one embodiment of the gas feeding device according to the system described herein, it is additionally or alternatively provided that the manipulator is arranged in the receiving unit in such a way in relation to a wall of the receiving unit that a gas flow channel is formed between the manipulator and the wall. In this way it is ensured that sufficient gas reaches the object.

In the case of yet another embodiment of the gas feeding device according to the system described herein, it is additionally or alternatively provided that a positioning device for moving the manipulator is arranged on the gas feeding device. For example, the movement is performed as already explained above. In the case of another embodiment of the gas feeding device according to the system described herein, it is provided that a longitudinal axis along which the manipulator is movable extends from the gas outlet to the positioning device. The manipulator is moved by means of the positioning device. For example, the positioning device is formed as a piezo actuator or as a servomotor. However, the system described herein is not restricted to these types of positioning device. Rather, any suitable type of positioning device can be used in the case of the system described herein.

In the case of yet another embodiment of the gas feeding device according to the system described herein, the manipulator has at least one manipulator tip. The object to be examined or part of the object to be examined may for example be arranged at this manipulator tip. For example, material may be deposited by gas deposition on the surface of the object in such a way that the manipulator tip is connected to the object.

In the case of yet another embodiment of the gas feeding device according to the system described herein, it is additionally or alternatively provided that at least one sealing device is arranged on the receiving unit. The manipulator is arranged on the sealing device. In this way it is ensured for example that no gas can flow in the direction of the positioning device.

The system described herein is explained in more detail below on the basis of exemplary embodiments by means of figures, in which FIG. 1 shows a schematic representation of a particle beam device;

DETAILED DESCRIPTION OF VARIOUS EMBODIMENTS

Figure 1:
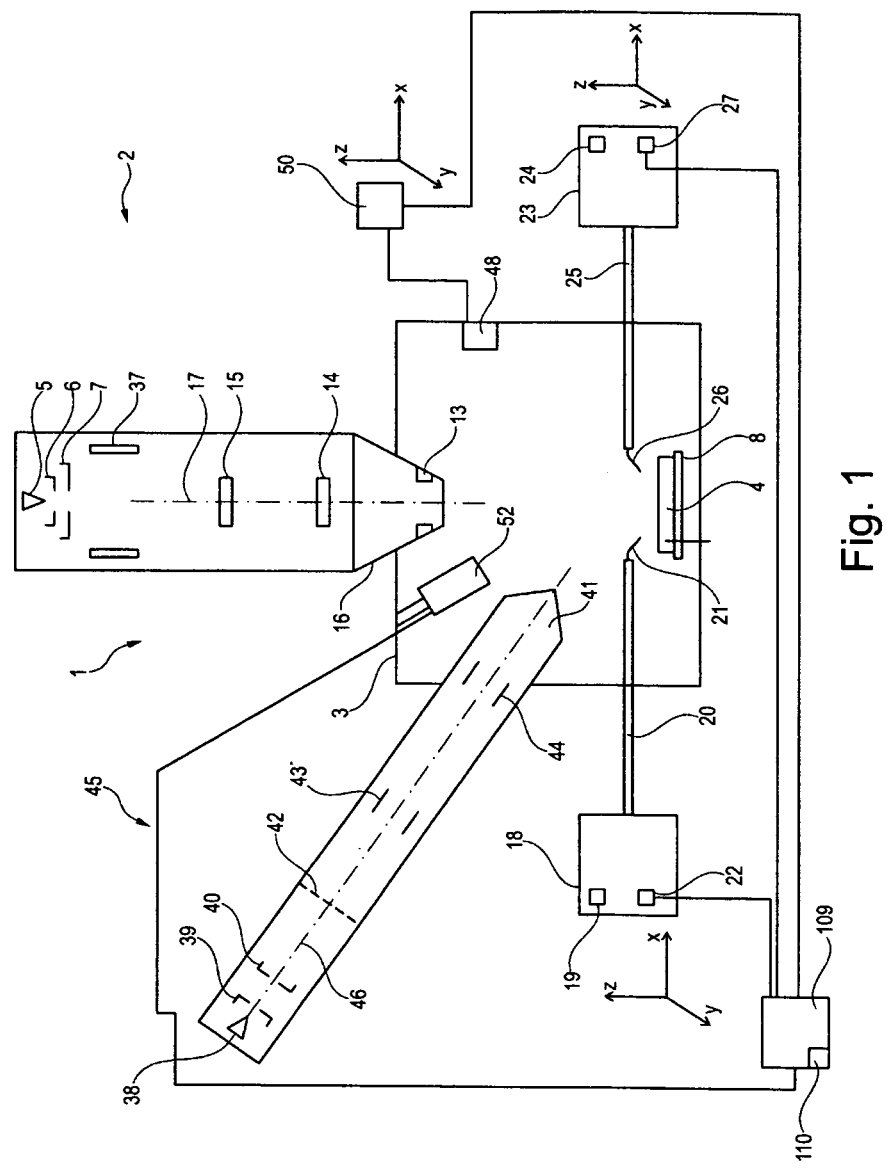

FIG. 1 shows a schematic representation of a particle beam device 1, with which the method according to the system described herein can be carried out. The particle beam device 1 has two particle beam columns, to be specific a first particle beam column 2 and a second particle beam column 45, which is arranged on a specimen chamber 3. The first particle beam column is formed as an electron beam column and is arranged vertically with regard to the specimen chamber 3.

The first particle beam column 2 has a beam generator 5 in the form of an electron source—a cathode—and a system consisting of a first electrode 6 and a second electrode 7. The second electrode 7 forms one end of a beam guiding tube (not represented). For example, the beam generator 5 is formed as a thermal field emitter. Electrons that emerge from the beam generator 5 are accelerated to a predeterminable potential on account of a potential difference between the beam generator 5 and the second electrode 7 and form a primary electron beam. The beam guiding tube is led through an opening in a magnetic lens acting as an objective lens 16. The objective lens 16 is provided with pole pieces (not represented), in which coils (not represented) are arranged. Furthermore, scanning devices 13 are provided, by which the primary electron beam can be deflected and scanned over an object 4 arranged in the specimen chamber 3. The object 4 is arranged on an adjustable object holder 8. The object holder 8 is formed movably in three directions arranged perpendicularly to one another—to be specific an x direction, a y direction and a z direction. Furthermore, it is rotatable about a first rotation axis and about a second rotation axis, the first rotation axis and the second rotation axis being arranged perpendicularly to one another. It is explicitly pointed out that the object holder 8 is additionally or alternatively also movable along at least one further axis or rotatable about at least one further axis.

For the imaging, secondary electrons and/or backscattered electrons that are caused by the interaction of the primary electron beam with the object 4 are detected by a detector arrangement of the particle beam device 1. For this purpose, a first detector 14 is arranged on the object side along a first optical axis 17 of the first particle beam column 2, while a second detector 15 is arranged on the source side (that is to say in the direction of the beam generator 5) along the first optical axis 17. Both the first detector 14 and the second detector 15 are oriented in the direction of the object 4 or the space arranged in front of the object 4. Furthermore, the first detector 14 and the second detector 15 are arranged offset from one another in the axial direction. It is explicitly pointed out that the particle beam device 1 may additionally or alternatively be provided with at least one further detector. For example, the particle beam device has a third detector 52, which is arranged in the specimen chamber 3. The third detector 52 is connected to a control unit 109, which has a processor 110. The third detector 52 is adjustably formed and can be moved along three axes aligned perpendicularly to one another. The movement of the third detector 52 is controlled by means of the control unit 109.

The second particle beam column 45 is formed as an ion beam column and is arranged tilted by an angle of about 50° in relation to the first particle beam column 2. The second particle beam column 45 has an ion beam generator 38. The ion beam generator 38 generates ions, which form an ion beam. For example, the ion beam is formed from noble gas ions. In particular, it is envisaged to form the ion beam from argon ions. However, the system described herein is not restricted to argon ions. Rather, other types of ion, for example, Ga ions, Au ions, Si ions and/or He ions, can also be used.

The ions are accelerated to a predeterminable potential by means of an extraction electrode 39. The ion beam then passes through an ion optics of the second particle beam column 45, the ion optics having a condenser lens 40 and an arrangement of further lenses 41. The lenses 41—in the form of an objective lens—generate a focused ion probe, which impinges on the object 4. Arranged above the lenses 41—that is to say in the direction of the ion beam generator 38—are a selectable diaphragm 42, a first electrode arrangement 43 and a second electrode arrangement 44, the first electrode arrangement 43 and the second electrode arrangement 44 being formed as scanning electrodes.

The ion beam is guided along a second optical axis 46. By means of the first electrode arrangement 43 and the second electrode arrangement 44, the ion beam is scanned over the surface of the object 4, the first electrode arrangement 43 acting in a first direction and the second electrode arrangement 44 acting in a second direction, which is opposite to the first direction. Consequently, the scanning is performed for example in the x direction. The scanning in a y direction perpendicular thereto is performed by further electrodes (not represented), turned by 90°, on the first electrode arrangement 43 and on the second electrode arrangement 44.

The second particle beam column 45 has two functions. On the one hand, it can be used for imaging a region of interest on the surface of the object 4. Interaction particles are detected by the first detector 14 or the second detector 15. As an alternative thereto, it is provided that the interaction particles are detected by a further detector—for example by the third detector 52. On the other hand, however, it also serves for processing the region of interest on the surface of the object 4.

Also arranged on the specimen chamber 3 is a light beam device 48, with which a light beam can be guided onto the object 4. For example, the light beam device 48 produces a laser beam, which has for example a wavelength from the range of 0.1 μm to 250 μm. $CO_2$ lasers, excimer lasers, solid-state lasers, semiconductor lasers and dye lasers are particularly suitable as a light beam device 48. However, the system described herein is not restricted to the aforementioned types of laser. Rather, any suitable laser can be used. Alternatively or in addition to this, it is provided that the light beam is provided as UV light, for example with a wavelength of 1 nm to 400 nm. The light beam device 48 is formed movably in three directions arranged perpendicularly to one another—to be specific an x direction, a y direction and a z direction. Furthermore, it is rotatable about a first rotation axis and about a second rotation axis, the first rotation axis and the second rotation axis being arranged perpendicularly to one another. The movement in the various directions and/or the rotations about the first rotation axis and the second rotation axis are controlled by means of a movement device 50. The movement device 50 is connected to the control device 109 and is activated by the control device 109.

The particle beam device 1 also has a first gas feeding device 18, which serves for feeding a gas to a specific position on the surface of the object 4. The gas is held in a first gas storage system 19. The first gas feeding device 18 is provided with a first feed line 20. The first feed line 20 has in the direction of the object 4 a first cannula 21, which can be brought into the vicinity of the specific position on the surface of the object 4, for example at a distance of 10 μm to 1 mm. The first cannula 21 has a feeding opening, the diameter of which lies for example in the range of 10 μm to 1000 μm, for example in the range of 400 μm to 600 μm. The first gas feeding device 18 is also provided with a first adjusting unit 22, which allows an adjustment of the position of the first cannula 21 in all three spatial directions—to be specific the x direction, the y direction and the z direction—and also an adjustment of the orientation of the first cannula 21 by a turning and/or tilting. The first adjusting unit 22 is connected to the control device 109 and is activated by the control device 109.

Provided in addition to the first gas feeding device 18 is a second gas feeding device 23, which is intended for feeding a precursor for a protective layer—hereinafter referred to as a protective layer precursor—to the specific position on the surface of the object 4. The protective layer precursor, for example a metal precursor, serves in the interaction with a particle beam or a light beam for applying a protective layer to the object 4 in such a way that partial regions on the surface of the object 4 are covered and protected. The protective layer precursor is gaseous and is held in a second gas storage system 24. The second gas feeding device 23 is also provided with a second feed line 25, which protrudes into the specimen chamber 3. The second feed line 25 has in the direction of the object 4 a second cannula 26, which can be brought into the vicinity of the predeterminable location on the surface of the object 4, for example at a distance of 10 μm to 1 mm. The second cannula 26 has a feeding opening, the diameter of which lies for example in the range of 10 μm to 1000 μm, for example in the range of 400 μm to 600 μm. The second gas feeding device 23 is also provided with a second adjusting unit 27, which allows an adjustment of the position of the second cannula 26 in all three spatial directions—to be specific the x direction, the y direction and the z direction—and also an adjustment of the orientation of the second cannula 26 by a turning and/or tilting. The second adjusting unit 27 is connected to the control device 109 and is activated by the control device 109.

In the case of other exemplary embodiments, the first gas storage system 19 of the first gas feeding device 18 and/or the second gas storage system 24 of the second gas feeding device 23 are not directly arranged on the first gas feeding device 18 or the second gas feeding device 23. Rather, it is provided in the case of these other exemplary embodiments that the first gas storage system 19 and/or the second gas storage system 24 is/are arranged for example on a wall of a space in which the particle beam device 1 is located. The first gas feeding device 18 serves for feeding the gaseous contrast agent precursor, with the ion beam and the gaseous contrast agent precursor interacting at the specific position on the surface of the object 4 in such a way that a layer of contrast agent is deposited at the specific location on the surface of the object 4. The same applies correspondingly to the second gas feeding device 23. It serves for feeding the protective layer precursor, with the ion beam and the protective layer precursor interacting at the specific position on the surface of the object 4 in such a way that a protective layer is deposited at the specific location on the surface of the object 4.

It is explicitly pointed out that the gas feeding devices described above are only to be understood as being given by way of example. The system described herein is not restricted to the gas feeding devices described above. Rather, any suitable gas feeding device or any suitable gas feeding devices can be used for the system described herein, in particular a gas feeding system with numerous gas feeding devices.

Figure 2:
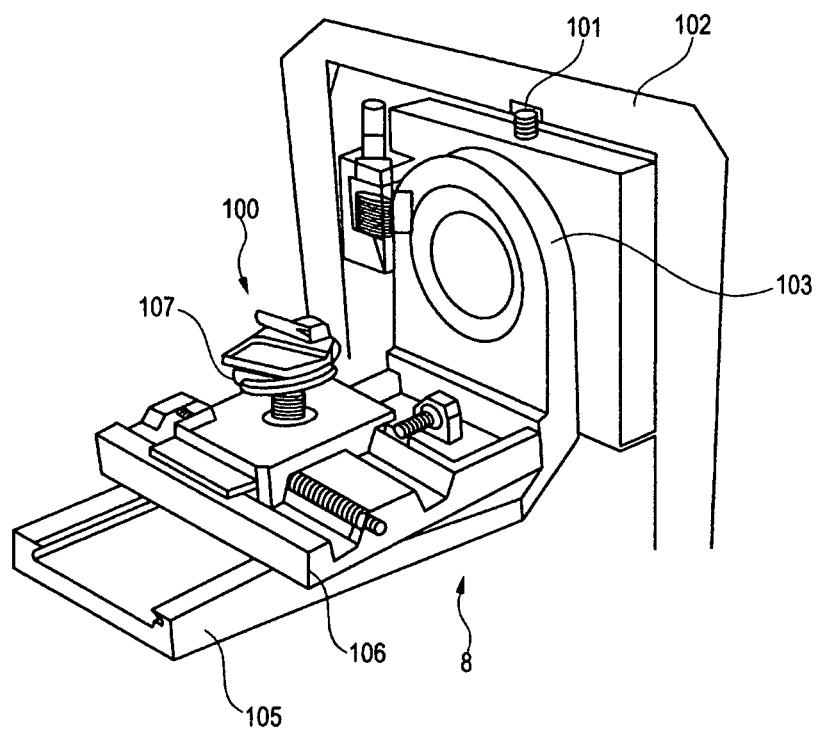
FIG. 2 shows a schematic representation of an object holder for the particle beam device according to FIG. 1.
Figure 3:
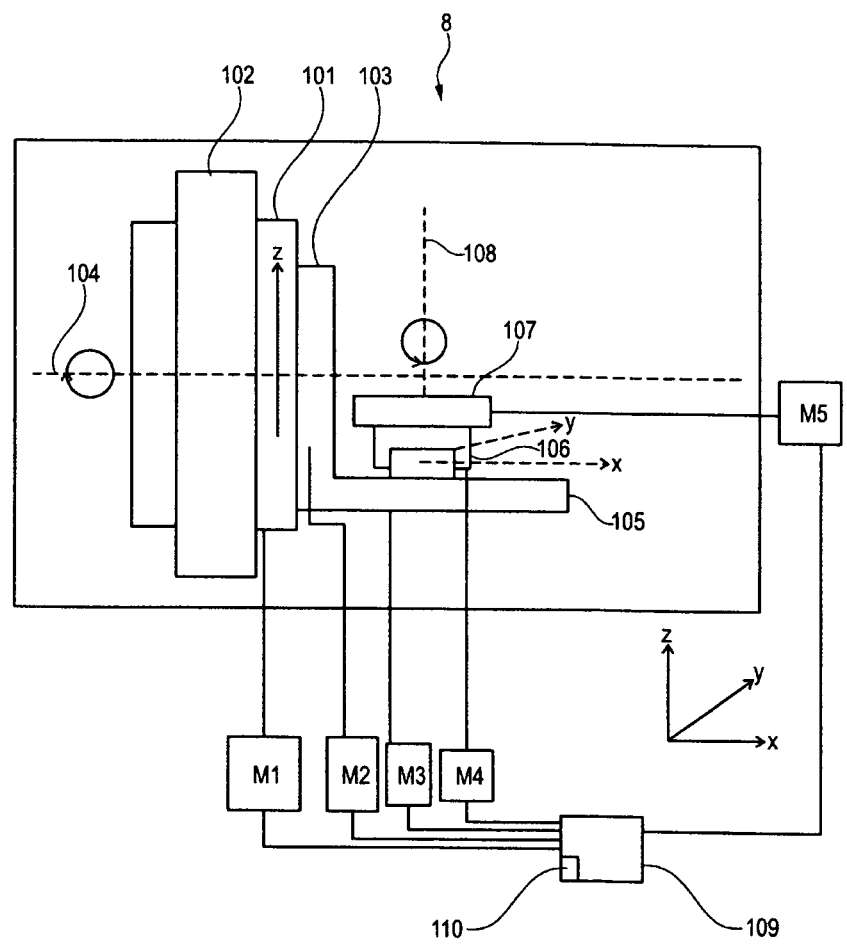
FIG. 3 shows a further schematic representation of the object holder as shown in FIG. 2.

There now follows a more detailed description of the object holder 8. The object holder 8 is formed as a movable specimen table, which is schematically represented in FIGS. 2 and 3. It is already pointed out now that the system described herein is not restricted to the object holder 8 described here. Rather, the system described herein may be provided for any configuration of a movable object holder. The object holder 8 has a specimen receptacle 100, on which the object 4 is arranged. The object holder 8 formed as a specimen table has movement elements, which ensure a movement of the object holder 8 in such a way that a region of interest on the object 4 can be examined by means of a particle beam. The movement elements are schematically represented in FIGS. 2 and 3 and are explained below.

The object holder 8 has a first movement element 101 on a housing 102 of the specimen chamber 3, in which the object holder 8 is arranged and which is connected to the aforementioned particle beam columns 2 and 45. This first movement element 101 allows a movement of the object holder 8 along the z axis—a first translation axis. Also provided is a second movement element 103. The second movement element 103 allows a rotation of the object holder 8 about a first rotation axis 104, which is also referred to as the tilt axis. This second movement element 103 serves for tilting the object 4 arranged in the specimen receptacle 100 about the first rotation axis 104.

Arranged in turn on the second movement element 103 is a third movement element 105, which is formed as a guide for a carriage and ensures that the object holder 8 is movable in the x direction—a second translation axis. The aforementioned carriage is in turn a further movement element, to be specific a fourth movement element 106. The fourth movement element 106 is formed in such a way that the object holder 8 is movable in the y direction—a third translation axis. For this purpose, the fourth movement element 106 has a guide, guided in which is a further carriage, on which the specimen receptacle 100 is arranged.

The specimen receptacle 100 is in turn formed with a fifth movement element 107, which allows the specimen receptacle 100 to be rotatable about a second turning axis—a second rotation axis 108. The second rotation axis 108 is aligned perpendicularly to the first rotation axis 104.

On the basis of the arrangement described, the object holder 8 of the exemplary embodiment discussed here has the following kinematic chain: first movement element 101 (movement along the z axis)—second movement element 103 (rotation about the first rotation axis 104)—third movement element 105 (movement along the x axis)—fourth movement element 106 (movement along the y axis)—fifth movement element 107 (rotation about the second rotation axis 108).

In the case of another exemplary embodiment (not represented here), it is envisaged to provide further movement elements, so as to allow movements along further translational axes and/or about further rotation axes.

As can be seen from FIG. 3, each of the aforementioned movement elements is connected to a stepping motor. Thus, the first movement element 101 is connected to a first stepping motor M1 and is driven on the basis of a driving force produced by the first stepping motor M1. The second movement element 103 is connected to a second stepping motor M2, which drives the second movement element 103. The third movement element 105 is in turn connected to a third stepping motor M3. The third stepping motor M3 produces a driving force for the third movement element 105. The fourth movement element 106 is connected to a fourth stepping motor M4, the fourth stepping motor M4 driving the fourth movement element 106. The fifth movement element 107 is also connected to a fifth stepping motor M5. The fifth stepping motor M5 produces a driving force, which drives the fifth movement element 107. The aforementioned stepping motors M1-M5 are controlled by the control unit 109. The control unit 109 has the processor 110, in which a computer program product that can execute a method explained further below has been loaded.

The control unit 109 is connected to an operating unit (not represented), which controls the positions of the object holder 8 formed as a specimen table. For example, the operating unit can be used here to input a new position of the object holder 8, and consequently a new position of the object 4. After the input command, the object holder 8 travels to the predetermined new position. Knowing the step size of the drive (that is to say the displacement distance or the tilting angle that is achieved for every step of the stepping motor concerned (M1-M5)), for this purpose the number of steps required to reach the new position is calculated for each of the stepping motors M1-M5 from the required displacement path or the required angular change of the object holdet 8. It is subsequently determined within what number of steps the new position can be achieved.

The first gas feeding device 18, the second gas feeding device 23, the light beam device 48 and the third detector 52 are components of the particle beam device 1 that can be set in their position in the particle beam device 1. Further components that can be set in their position in the particle beam device are a manipulator for processing an object, a device for removing at least part of the object from the object and/or a particle beam source.

Figure 4:
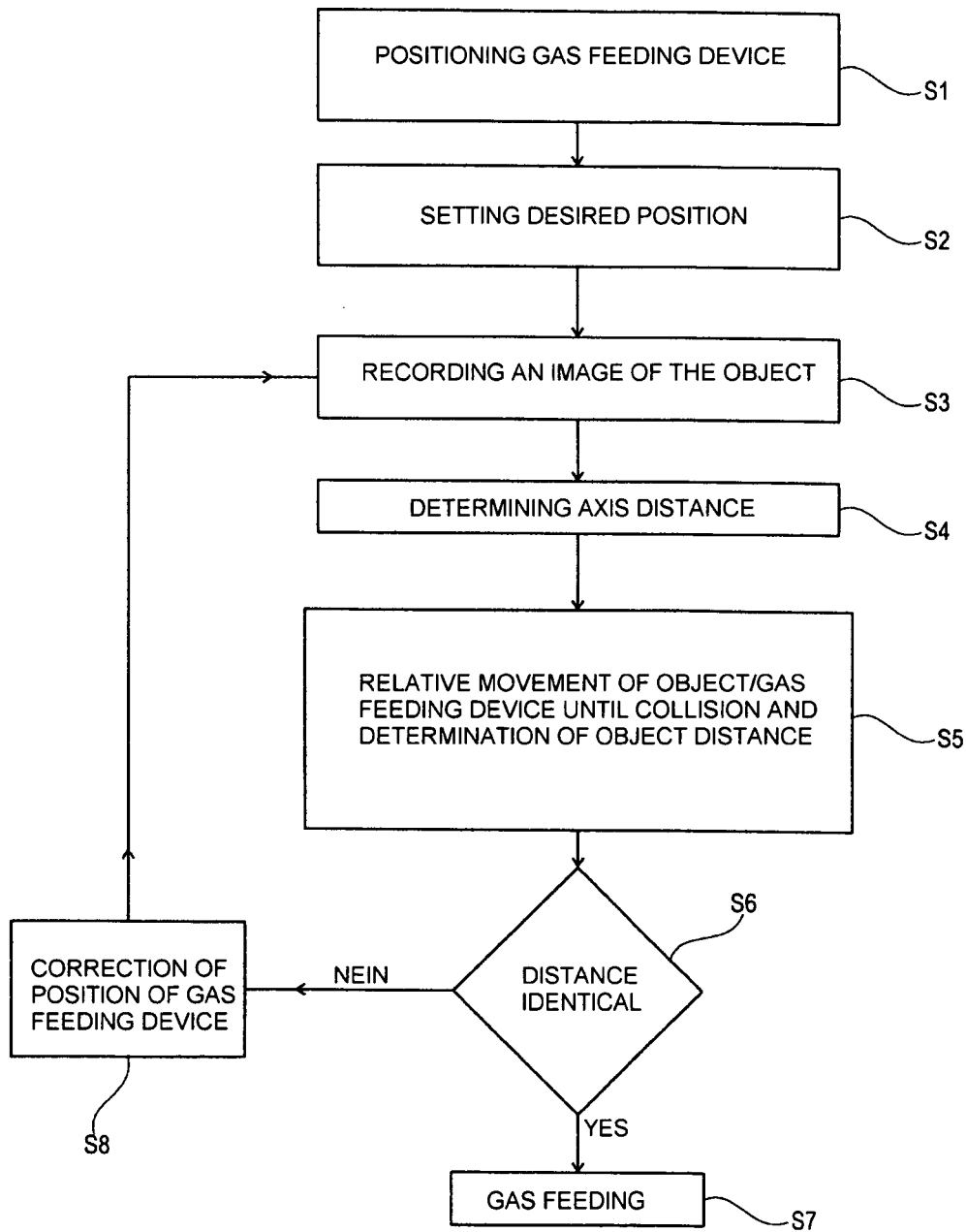
FIG. 4 shows a schematic representation of a sequence of steps of an embodiment of the method according to the system described herein.

FIG. 4 schematically shows a flow diagram of an exemplary embodiment of the method according to the system described herein for setting a position of a component in the particle beam device 1. This is explained by way of example for the first gas feeding device 18. However, the method according to the system described herein can also be used for setting the position of any other of the aforementioned components.

In a first method step S1, a positioning of the first cannula 21 of the first gas feeding device 18 is performed. The positioning of the first cannula 21 of the first gas feeding device 18 is performed to any desired position. This may for example already be in the vicinity of a region on the surface of the object 4 to which the gaseous contrast agent precursor is to be guided.

In a further method step S2, the setting of a desired position of the first cannula 21 of the first gas feeding device 18 is then performed. The desired position is that position which the first cannula 21 is intended to assume and which is chosen in such a way that a sufficient amount of the gaseous contrast agent precursor can be guided to the region of the surface of the object 4. In this desired position, the first cannula 21 is aligned by its tip and opening sufficiently well with the region on the surface of the object 4 to which the gaseous contrast agent precursor is to be guided. In the case of a particular exemplary embodiment, the desired position is chosen in such a way that the first cannula 21 is arranged at a distance of a few μm, for example 1 μm to 10 μm, from the point of coincidence of the electron beam and the ion beam and is aligned by its tip with the point of coincidence.

The desired position may for example be determined from empirical values. It may however also be calculated. This is explained in more detail on the basis of FIGS. 5 and 6.

Figure 5:
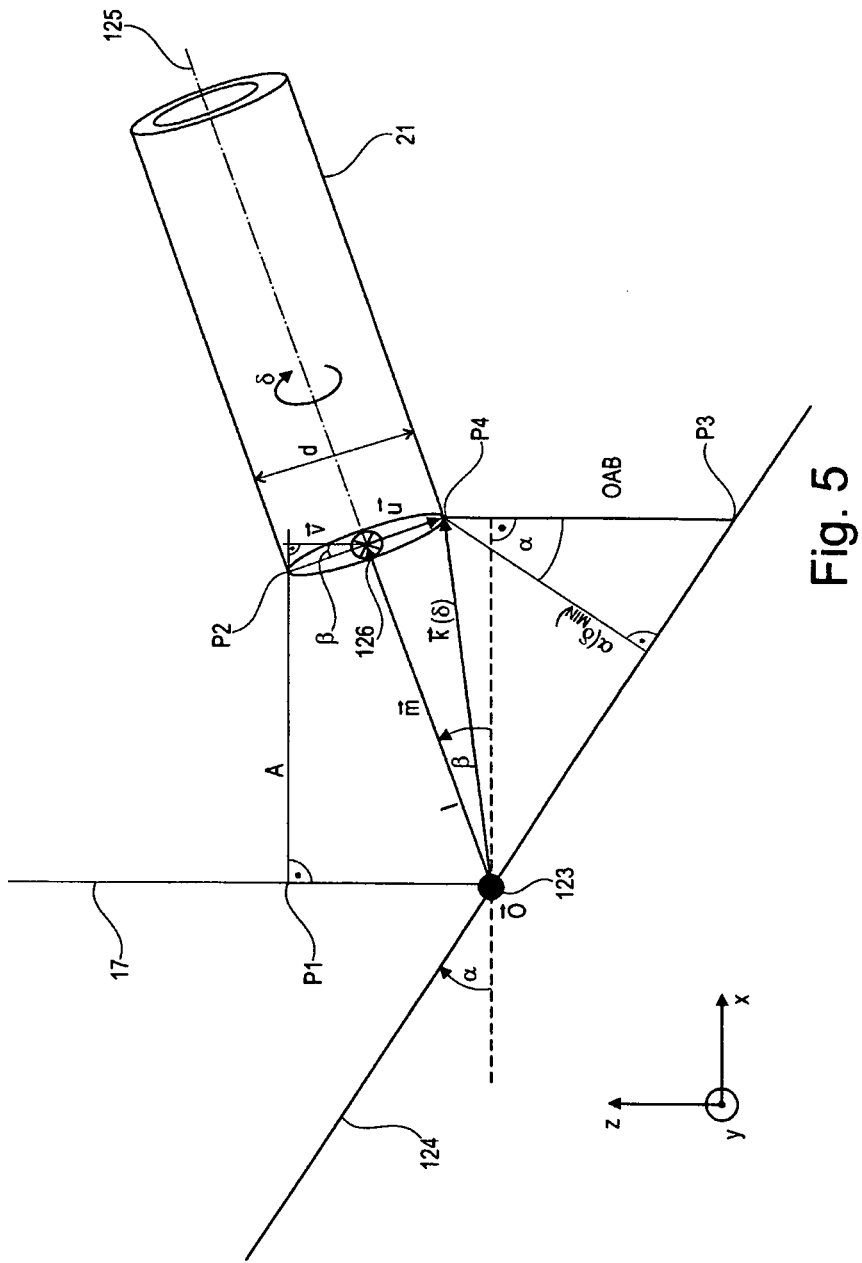
FIG. 5 shows a schematic representation for the explanation of variables for the calculation of a desired position.
Figure 6:
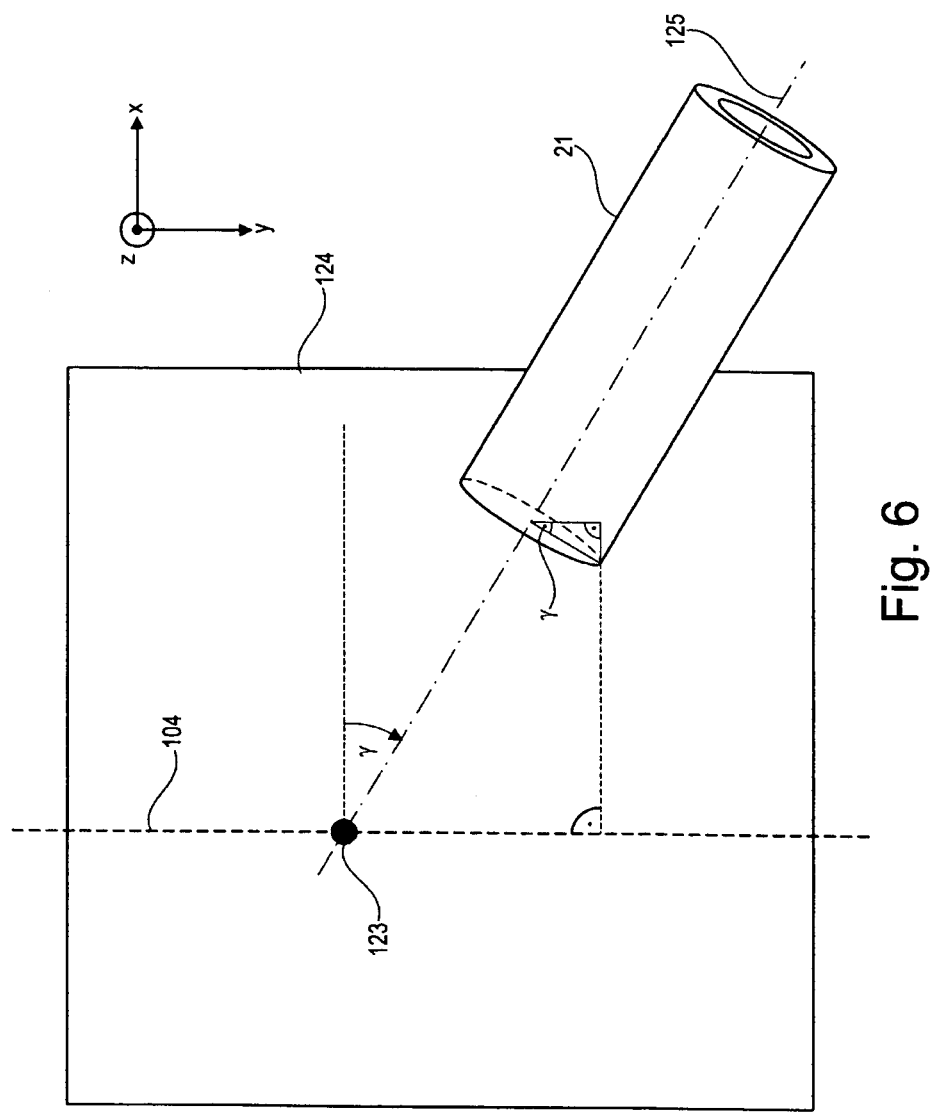
FIG. 6 shows another schematic representation for the explanation of the variables for the calculation of a desired position.

FIG. 5 shows the first optical axis 17 of the first particle beam column 2. At the point of coincidence 123, the second optical axis (not represented) of the second particle beam column 45 impinges on the first optical axis 17 of the first particle beam column 2. The point of coincidence 123 lies on the surface 124 of the object 4. This is the processing point. In other words, the region on the surface 124 of the object 4 that is to be processed and/or analyzed is located at the point of coincidence 123. Also represented is the first cannula 21 of the first gas feeding device 18. The first cannula 21 has a cylindrical cross section. Through the circular center 126 of the cylindrical cross section there runs a longitudinal axis 125, which is intended to be aligned with the point of coincidence 123. FIG. 6 shows a plan view along the first optical axis 17 of the first particle beam column 2 of the arrangement that is schematically represented in FIG. 5.

In FIGS. 5 and 6, variables are depicted, with their meaning being explained below.

A denotes the axis distance between the first optical axis 17 and the periphery of the first cannula 21. The axis distance is given by the length of a straight line that is aligned perpendicularly to the optical axis 17 and joins a point P1 on the first optical axis 17 to a point P2 on the surface of the first cannula 21 directed toward the first optical axis 17, the point P1 on the first optical axis 17 being arranged closest to the point P2 on the surface of the first cannula 21.

d denotes the outer effective diameter of the first cannula 21. It is dictated by the geometry of the first cannula 21.

The angle $\alpha$ is the tilting angle of the surface 124 of the object 4 with regard to the horizontal alignment of the surface 124 of the object 4. The tilting angle $\alpha$ is set by rotation about the first rotation axis 104.

$\beta$ corresponds to an angle of attack of the first cannula 21. This is the angle between the longitudinal axis 125 and the horizontal alignment of the surface 124 of the object 4. This is dictated by the geometry of the first cannula 21 and a specimen chamber flange on which the first gas feeding device 18 is arranged.

The angle $\gamma$ is an angle of rotation of the first cannula 21. This identifies the angular arrangement between the longitudinal axis 125 and a straight line that is aligned both perpendicularly to the first optical axis 17 and perpendicularly to the first rotation axis 104. Furthermore, the angle $\gamma$ is an angle of projection, which is obtained by projecting the longitudinal axis 125 into the plane of the object 4.

The object distance, that is to say the distance between a point P3 on the surface 124 of the object 4 and a point P4 which is arranged on a surface of the first cannula 21 that is directed to the surface 124 of the object 4, is denoted by OAB. The object distance OAB is given by the length of a straight line that is aligned parallel to the optical axis 17 and joins the point P3 on the surface 124 of the object 4 to the point P4 of the first cannula 21, which is arranged closest to the point P3 on the surface 124 of the object 4. The object distance OAB is a function of the variables A, d, $\alpha$, $\beta$ and $\gamma$. For this it follows that $$OAB = f(A, d, \alpha, \beta, \gamma).$$

l denotes the distance between the point of coincidence 123 and the first cannula 21. The distance l is also referred to as the working distance. The distance l is given by the length of a straight line that is the extension of the longitudinal axis 125, the extension running through the circular center 126 of the opening of the first cannula 21 and through the point of coincidence 123. The distance l is the length of the straight line between the point of coincidence 123 and the circular center 126 of the opening. The working distance l is a function of the variables A, d, $\beta$ and $\gamma$. For this it follows that $$l = f(A, d, \beta, \gamma)$$

The aforementioned variables, which can be freely chosen, can thus be used to calculate the associated object distance OAB, which unequivocally sets the desired position of the first cannula 21. The calculation involved takes place as follows, it being assumed in first approximation thereof that the surface 124 of the object 4 is planar.

In the case of the exemplary embodiment referred to here, it is assumed that the following relationships apply: $0° \leq \alpha \leq 90°$, $0° \leq \beta \leq 90°$ and also $0° \leq \gamma \leq 360°$. It is also assumed that the opening of the first cannula 21 in first approximation is a circle, which is arranged in a circular plane. Then the following unit vectors form an orthonormal basis of the circular plane:

$$\vec{u} = \begin{pmatrix} u_x \\ u_y \\ u_z \end{pmatrix} = \frac{1}{\sqrt{(u'_x)^2 + (u'_y)^2 + (u'_z)^2}} \begin{pmatrix} u'_x \\ u'_y \\ u'_z \end{pmatrix} \quad [1]$$

$$\vec{v} = \begin{pmatrix} v_x \\ v_y \\ v_z \end{pmatrix} = \frac{1}{\sqrt{(v'_x)^2 + (v'_y)^2 + (v'_z)^2}} \begin{pmatrix} v'_x \\ v'_y \\ v'_z \end{pmatrix} \quad [2]$$

It is also assumed that the point of coincidence 123 is the origin of the coordinates. Then the following vector is the center-point vector, that is to say the vector that runs from the point of coincidence 123 to the circular center 126:

$$\vec{m} = \begin{pmatrix} m_x \\ m_y \\ m_z \end{pmatrix} \quad [3]$$

It is also assumed that $\delta$ is the inscribed angle of the circle. Every point on the circle can then be described by the following vector:

$$\vec{k}(\delta) = \vec{m} + \frac{d}{2}(\vec{u} \cos \delta + \vec{v} \sin \delta) \quad [4]$$

On the basis of the geometrical relationships given in FIGS. 5 and 6, the following is then obtained for the coordinates of the center-point vector:

$$m_x = \left(x + \frac{d}{2}\sin\beta\right)\cos\gamma = x\cos\gamma + \frac{d}{2}\sin\beta\cos\gamma \quad [5]$$

$$m_y = m_x(\gamma = 0)\tan\beta = x\tan\beta + \frac{d}{2}\sin\beta\tan\beta \quad [6]$$

$$m_z = \left(x + \frac{d}{2}\sin\beta\right)\sin\gamma = x\sin\gamma + \frac{d}{2}\sin\beta\sin\gamma \quad [7]$$

This implies for the center-point vector that:

$$\vec{m} = \left(x + \frac{d}{2}\sin\beta\right)\begin{pmatrix}\cos\gamma \\ \tan\beta \\ \sin\gamma\end{pmatrix} \quad [8]$$

The following thus applies for the working distance l between the point of coincidence 123 and the circular center 126:

$$l = |\vec{m}| \quad [9]$$

On the basis of the geometrical relationships given in FIGS. 5 and 6, it can be derived that the following thus applies for the orthonormal basis of the aforementioned circle:

$$u'_x = \frac{d}{2}\sin\beta\cos\gamma \quad [10]$$

$$u'_y = -\frac{d}{2}\cos\beta \quad [11]$$

$$u'_z = \frac{d}{2}\sin\beta\sin\gamma \quad [12]$$

$$\sqrt{(u'_x)^2 + (u'_y)^2 + (u'_z)^2} = \frac{d}{2}\sqrt{\sin^2\beta + \cos^2\gamma + \cos^2\beta + \sin^2\gamma} \quad [13]$$

$$v'_x = \frac{d}{2}\sin\gamma \quad [14]$$

$$v'_y = 0 \quad [15]$$

$$v'_z = -\frac{d}{2}\cos\gamma \quad [16]$$

$$\sqrt{(v'_x)^2 + (v'_y)^2 + (v'_z)^2} = \frac{d}{2}\sqrt{\sin^2\neq + \cos^2\gamma} = \frac{d}{2} \quad [17]$$

Furthermore, base unit vectors of the opening of the first cannula 21 can be described as follows:

$$\vec{u} = \frac{1}{\sqrt{\sin^2\beta\cos^2\gamma + \cos^2\beta + \sin^2\beta\sin^2\gamma}}\begin{pmatrix}\sin\beta\cos\gamma \\ -\cos\beta \\ \sin\beta\sin\gamma\end{pmatrix} \quad [18]$$

$$\vec{v} = \begin{pmatrix}\sin\gamma \\ 0 \\ -\cos\gamma\end{pmatrix} \quad [19]$$

The surface of the object can then be described by a normal vector, where:

$$\vec{n} = \begin{pmatrix}n_x \\ n_y \\ n_z\end{pmatrix} = \frac{1}{\sqrt{(n'_x)^2 + (n'_y)^2 + (n'_z)^2}}\begin{pmatrix}n'_x \\ n'_y \\ n'_z\end{pmatrix} \quad [20]$$

On the basis of the geometrical relationships given in FIGS. 5 and 6, the following is obtained:

$$\vec{n} = \begin{pmatrix}n_x \\ n_y \\ 0\end{pmatrix} = \frac{1}{\sqrt{(n'_x)^2 + (n'_y)^2}}\begin{pmatrix}n'_x \\ n'_y \\ 0\end{pmatrix} \quad [21]$$

Furthermore, on the basis of the geometrical relationships given in FIGS. 5 and 6, the following is obtained:

$$n'_x = b\sin\alpha \quad [22]$$

$$n'_y = b\cos\beta \quad [23]$$

$$\sqrt{(n'_x)^2 + (n'_x)^2} = b\sqrt{\sin^2\alpha + \cos^2\alpha} = b \quad [24]$$

where the parameter b can be chosen at will. Consequently, the normal unit vector can be described as follows:

$$\vec{n} = \begin{pmatrix}n_x \\ n_y \\ 0\end{pmatrix} = \begin{pmatrix}\sin\alpha \\ \cos\alpha \\ 0\end{pmatrix} \quad [25]$$

The distance "a" of any desired point on the aforementioned circle from the plane of the object surface is then obtained from:

$$a(\delta) - \vec{n}\vec{k}(\delta) = \vec{n}\vec{m} + \frac{d}{2}\vec{n}\vec{u}\cos\delta + \frac{d}{2}\vec{n}\vec{v}\sin\delta \quad [26]$$

To ascertain the shortest distance a, the minimum is thus determined. This is given when the first derivative of $a(\delta)$ equals zero and the second derivative of $a(\delta)$ is greater than zero.

The first derivative is $$a'(\delta) = -\frac{d}{2}\vec{n}\vec{u}\sin\delta + \frac{d}{2}\vec{n}\vec{v}\cos\delta \quad [27]$$

With the requirement that the first derivative is to be equal to zero, it follows that $$-\frac{d}{2}\vec{n}\vec{u}\sin\delta_0 + \frac{d}{2}\vec{n}\vec{v}\cos\delta_0 = 0 \quad [28]$$

$$\Leftrightarrow \tan\delta_0 = \frac{\sin\delta_0}{\cos\delta_0} = \frac{\vec{n}\vec{v}}{\vec{n}\vec{u}} \quad [29]$$

$$\Leftrightarrow \delta_0 = \arctan\frac{\vec{n}\vec{v}}{\vec{n}\vec{u}} \quad [30]$$

For the second derivative it thus applies that $$a''(\delta) = -\frac{d}{2}\vec{n}\vec{u}\cos\delta - \frac{d}{2}\vec{n}\vec{v}\sin\delta \quad [31]$$

It is therefore necessary to distinguish between two cases, to be specific on the one hand when the second derivative is less than zero (case 1), and on the other hand when the second derivative is greater than zero (case 2).

For case 1, it follows that $$a''(\delta) = -\frac{d}{2}\vec{n}\vec{u}\ \cos\delta_0 - \frac{d}{2}\vec{n}\vec{v}\sin\delta_0 < 0 \qquad [32]$$

It then applies that $$\delta_0 = \delta_{min} = \arctan\frac{\vec{n}\vec{v}}{\vec{n}\vec{u}} + \pi \qquad [33]$$

For case 2, it follows that $$a''(\delta) = -\frac{d}{2}\vec{n}\vec{u}\ \cos\delta_0 - \frac{d}{2}\vec{n}\vec{v}\sin\delta_0 > 0 \qquad [34]$$

Furthermore, it then applies that $$\delta_0 = \delta_{min} = \arctan\frac{\vec{n}\vec{v}}{\vec{n}\vec{u}} \qquad [35]$$

Taking into account the geometrical relationships given in FIGS. 5 and 6, it then applies that $$OAB = \frac{\alpha(\delta_{min})}{\cos\alpha} = \frac{\vec{n}\vec{m} + \frac{d}{2}(\vec{n}\cdot\vec{u})\cos\delta_{MIN} + \frac{d}{2}(\vec{n}\cdot\vec{v})\sin\delta_{MIN}}{\cos\alpha} \qquad [36]$$

The desired position is thus unequivocally determined by setting the axis distance associated with the desired position hereinafter referred to as the first axis distance—and calculating the associated object distance—hereinafter referred to as the first object distance.

Further method steps are now explained below on the basis of FIG. 4. In these method steps, the position that the first cannula 21 has in actual fact is determined, that is to say the actual position of the first cannula 21. Thus, firstly the actual distance A of the first cannula 21 from the first optical axis 17 of the first particle beam column 2 is determined. For this purpose, in a method step S3 an SEM image of the surface 124 of the object 4 is generated by means of the primary electron beam. By using the image of the surface 124, the second axis distance is then measured (method step S4). Accordingly, it is envisaged in the case of this embodiment to determine the second axis distance visually. This is performed for example by marking the tip of the first cannula 21, which can be seen in the image. The image is designed and recorded in such a way that the optical axis 17 runs through the center point of the image. By measuring the distance of the tip from the center point of the image, while taking into account the scale of the imaging, the second axis distance can be determined. As an alternative to this, it is envisaged to perform the measurement with regard to the image by means of an automated method. For example, the tip of the first cannula 21 is identified by means of image recognition software. Following that, the distance of the tip of the first cannula 21 from the center point of the image through which the optical axis 17 runs is determined. This distance is the second axis distance.

To determine the position of the first cannula 21 in actual fact, the distance of the first cannula 21 from the object 4 is thus also determined. This distance is the second object distance. The second object distance is determined in method step S5. In method step S5, the object 4 is moved in relation to the first cannula 21. This can be performed variously. On the one hand, the object 4, which is located in a second starting position, may be moved by moving the object holder 8 in the direction of the first cannula 21. On the other hand, the first cannula 21, which is located in a first starting position, may be moved by means of the first adjusting unit 22 in the direction of the object 4. As an alternative to this, it is provided that both the object 4, which is located in the second starting position, is moved by the object holder 8 in the direction of the first cannula 21 and the first cannula 21, which is located in the first starting position, is moved in the direction of the object 4. The movement of the object 4 by means of the object holder 8 and/or the first cannula 21 is thereby performed along a straight line that runs parallel to the optical axis 17 (for example the line between the point P3 and the point P4).

The movement of the object holder 8 and/or of the first cannula 21 is performed until the first cannula 21 makes contact with the object 4. If the first cannula 21 and the object 4 are formed as electrically conducting, the contacting of the first cannula 21 with the object 4 can be established for example by measuring the electrical resistance between the first cannula 21 and the object 4. As soon as the object 4 makes contact with the first cannula 21, for example, the electrical resistance between the first cannula 21 and the object 4 is reduced abruptly or stops completely. The measuring of the electrical resistance may for example be performed automatically and/or continuously, that is to say constantly.

In the case of another exemplary embodiment, the contacting may be established by visual observation. This exemplary embodiment is suitable in particular for non-conducting objects. In the case of this exemplary embodiment, it is provided that the object 4 and the first cannula 21 are imaged by the particle beam device 1 and an image of the object 4 and of the first cannula 21 is thereby generated. To be more precise, the object 4 and the first cannula 21 are irradiated and scanned by the first particle beam, that is to say the primary electron beam, of the first particle beam column 2. An interaction of the first particle beam with the object 4 and the first cannula 21 has the effect of producing interaction particles in the form of the secondary electrons and/or backscattered electrons, which are detected. The detection signals generated in the detection are used to generate the image of the object 4 and of the first cannula 21. The image is displayed on a monitor of the particle beam device 1. For example, the first cannula 21 produces a shadow on the surface 124 of the object 4 in the image that is displayed on the monitor of the particle beam device 1. The distance of the shadow with respect to the first cannula 21 is reduced as the first cannula 21 approaches the object 4. Consequently, in the case of this exemplary embodiment, the approach of the first cannula 21 to the object 4 is observable. When there is a movement of the first cannula 21 to the object 4, the first cannula 21 moves in a first direction in the image. When the first cannula 21 makes contact with the object 4, a slight, reversible bending of the first cannula 21 is detectable. This bending can be detected by the fact that the first cannula 21 then moves in a second direction in the image, the second direction being different from the first direction.

In the case of yet another embodiment, it is envisaged to move the object 4. For example, it is moved by the object holder 8 on which the object 4 is arranged being moved. If the first cannula 21 is already in contact with the object 4, the first cannula 21 thus bends during the movement of the object 4. This bending is evident visually in the image of the particle beam device 1 by a movement of the first cannula 21. If the cannula 21 is not yet in contact with the object 4, when there is a movement of the object 4 there is not yet any visually evident movement of the first cannula 21 in the image of the particle beam device 1.

Irrespective of how the contacting of the first cannula 21 with the object 4 is ultimately established, the movement of the object holder 8 and/or of the first cannula 21 is stopped as soon as the contacting is established. The distance covered by the object 4 during the movement from the second starting position and/or the distance covered by the first cannula 21 during the movement from the first starting position is measured. As soon as the first cannula 21 makes contact with the object 4, the distance covered by the object 4 (for the case where only the object 4 has been moved) or by the first cannula 21 (for the case where only the first cannula 21 has been moved) corresponds to the second object distance. If both the object 4 and the first cannula 21 have been moved, the addition of the distance covered by the object 4 and the distance covered by the first cannula 21 corresponds to the second object distance.

In a method step S6, the first axis distance is then compared with the second axis distance. Furthermore, the first object distance is compared with the second object distance. If the first axis distance does not coincide with the second axis distance and/or if the first object distance does not coincide with the second object distance, then the position of the first cannula 21 in actual fact—that is to say the ACTUAL position of the first cannula 21—does not correspond to the desired position. The position of the first cannula 21 is then corrected. This then takes place in a method step S8. In method step S8, the first cannula 21, if it has been moved, is returned again to the position (starting position) that it had during or before the recording of the last SEM image. Furthermore, the object holder 8, if it has been moved, is returned to the position (starting position) that the object holder 8 had during or before the recording of the last SEM image. Following that, the position of the first cannula 21 is changed in such a way that it is brought closer to the desired position. Following that, method steps S3 to S6 are repeated. This repetition continues until the first axis distance coincides with the second axis distance and until the first object distance coincides with the second object distance. As soon as the first axis distance coincides with the second axis distance and the first object distance coincides with the second object distance, the first cannula 21, if it has been moved, is returned again to the position (starting position) that it had during or before the recording of the last SEM image. Furthermore, the object holder 8, if it has been moved, is returned to the position (starting position) that the object holder 8 had during or before the recording of the last SEM image. The first cannula 21 is then positioned in the desired position. In method step S7, the gaseous contrast agent precursor can be guided exactly and in a sufficiently high concentration to the desired region on the surface 124 of the object 4.

In the case of another embodiment of the method according to the system described herein, the movement of the object 4 with the object holder 8 and/or the first cannula 21 is performed along the center-point vector. In this case, however, the following modification of equation 36 then applies for the object distance OAB, which is calculated with the variables evident from FIGS. 5 and 6:

$$OAB = \alpha(\delta_{min}) = \vec{n}\vec{m} + \frac{d}{2}(\vec{n}\vec{u})\cos\delta_{MIN} + \frac{d}{2}(\vec{n}\cdot\vec{v})\sin\delta_{MIN} \qquad [37]$$

The method according to the system described herein is particularly well-suited for being carried out in an automated manner.

Figure 7:
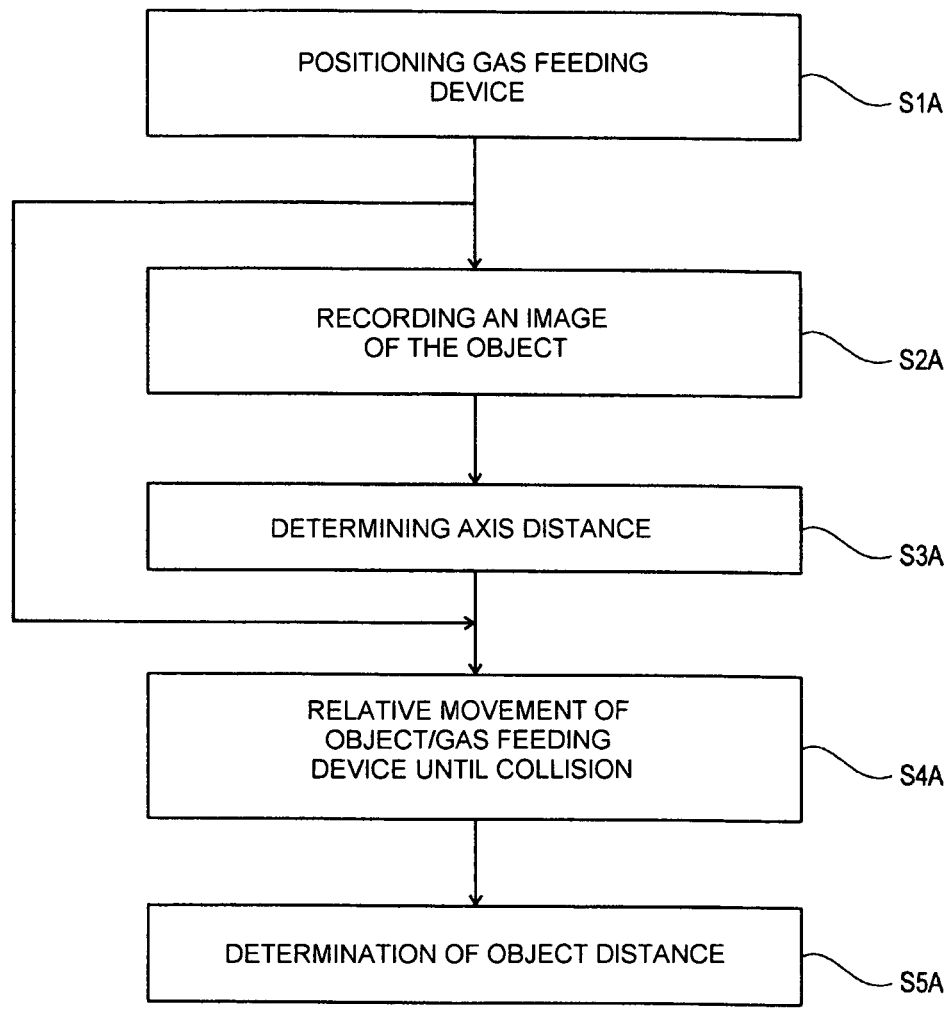
FIG. 7 shows a schematic representation of a sequence of steps of another embodiment of the method according to the system described herein.

FIG. 7 shows another exemplary embodiment of the method according to the system described herein. In the case of this exemplary embodiment, the distance between a component of the particle beam device 1 and the object 4 is determined. This is in turn explained by way of example for the first gas feeding device 18. However, the method according to the system described herein can also be used for measuring the distance of any other aforementioned component from the object 4.

In a first method step S1A, the positioning of the first cannula of the first gas feeding device 18 is performed. The positioning of the first cannula 21 of the first gas feeding device 18 is performed to any desired position. This may already be for example in the vicinity of a region on the surface of the object 4 to which the gaseous contrast agent precursor is to be guided. In the case of the exemplary embodiment explained here, the distance of the first cannula 21 from the first optical axis 17 of the first particle beam column 2 is determined. For this purpose, in method step S2A an SEM image of the surface 124 of the object 4 is generated by means of the primary electron beam. Using the image of the surface 124, the axis distance is then measured (method step S3A). Accordingly, it is envisaged in the case of this embodiment to determine the axis distance visually. This is performed for example by marking the tip of the first cannula 21, which can be seen in the image. The image is designed and recorded in such a way that the optical axis 17 runs through the center point of the image. By measuring the distance of the tip from the center point of the image, while taking into account the scale of the imaging, the axis distance can be determined. As an alternative to this, it is envisaged to perform the measurement with regard to the image by means of an automated method. For example, the tip of the first cannula 21 is identified by means of image recognition software. Following that, the distance of the tip of the first cannula 21 from the center point of the image through which the optical axis 17 runs is determined. This distance is the axis distance.

Furthermore, in the case of the exemplary embodiment explained here, the distance of the first cannula 21 from the object 4 is determined. In method step S4A, the object 4 is moved in relation to the first cannula 21. This can be performed variously. On the one hand, the object 4, which is located in a second starting position, may be moved by moving the object holder 8 in the direction of the first cannula 21. On the other hand, the first cannula 21, which is located in a first starting position, may be moved by means of the first adjusting unit 22 in the direction of the object 4. As an alternative to this, it is provided that both the object 4, which is located in the second starting position, is moved by the object holder 8 in the direction of the first cannula 21 and the first cannula 21, which is located in the first starting position, is moved in the direction of the object 4. The movement of the object 4 by means of the object holder 8 and/or the first cannula 21 is thereby performed along a straight line that runs parallel to the optical axis 17 (for example the line between the point P3 and the point P4) or that corresponds to a normal to the surface 124 of the object 4.

The movement of the object holder 8 and/or of the first cannula 21 is performed until the first cannula 21 makes contact with the object 4. The contacting of the first cannula 21 with the object 4 can be established for example as already explained further above. As soon as the first cannula 21 makes contact with the object 4, the movement of the object holder 8 and/or of the first cannula 21 is stopped. The distance covered by the object 4 during the movement from the second starting position and/or the distance covered by the first cannula 21 during the movement from the first starting position is/are measured (method step S5A). As soon as the first cannula 21 makes contact with the object 4, the distance covered by the object 4 (for the case where only the object 4 has been moved) or by the first cannula 21 (for the case where only the first cannula 21 has been moved) corresponds to the object distance. If both the object 4 and the first cannula 21 have been moved, the addition of the distance covered by the object 4 and the distance covered by the first cannula 21 corresponds to the object distance.

In the case of another embodiment of the method according to the system described herein as shown in FIG. 7, it dispenses with the determination of the axis distance and determines the object distance directly. Accordingly, method step S1A is followed by the method step S4A.

It has always been assumed with the aforementioned embodiments that the object 4 is of such a size that it can make contact with the first cannula 21 when there is a movement of the object holder 8 and/or of the first cannula 21.

Also in the case of the embodiment of the method according to the system described herein that is represented in FIG. 7, the movement of the object 4 with the object holder 8 and/or the first cannula 21 may be performed along the center-point vector.

Figure 8:
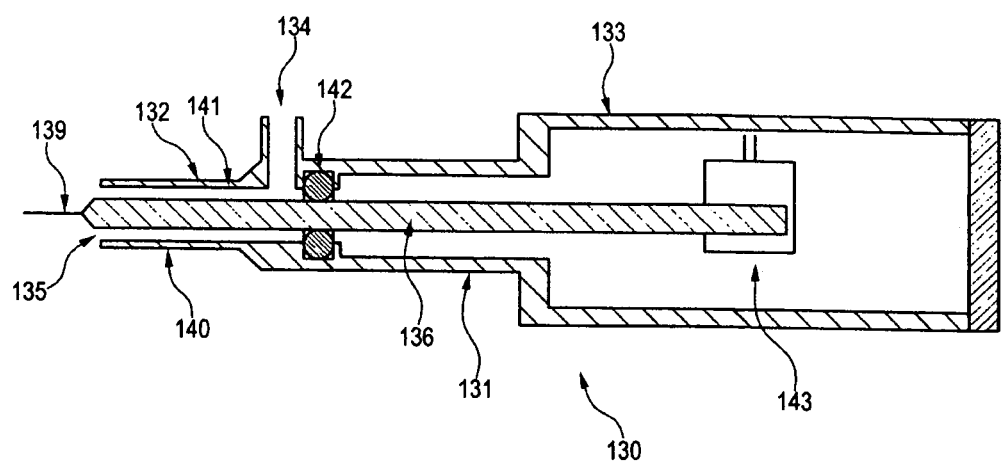
FIG. 8 shows a schematic representation of an embodiment of a gas feeding device.

FIG. 8 shows a further exemplary embodiment of a gas feeding device, to be specific a gas feeding device 130. The gas feeding device 130 serves for feeding at least one gas to an object, for example the object 4 in the aforementioned particle beam device 1, with which the object 4 can be analyzed and/or can be processed. The gas feeding device 130 has a receiving unit 131, which is of a substantially tubular form and has two portions, to be specific a first receiving unit portion 132 and a second receiving unit portion 133. Arranged on the first receiving unit portion 132 is a gas inlet 134. Arranged at the end of the first receiving unit portion 132 is a gas outlet 135. Furthermore, a manipulator 136 is movably arranged in the receiving unit 131. It can be moved along the longitudinal axis of the receiving unit 131 by a positioning device 143, which is arranged in the second receiving unit portion 133. A piezo actuator or a servomotor is suitable for example as the positioning device 143. The manipulator 136 has a manipulator tip 139 in the region of the gas outlet 135.

Between the gas inlet 134 and the positioning device 143, an interior space of the receiving unit 131, in which the manipulator 136 is arranged, is cut off by a sealing device 142. This sealing device 142 serves as a seal with respect to the gas flow and also as a rotating point for the manipulator 136. By means of the positioning device 143, which is arranged in the second receiving unit portion 133 of the receiving unit 131, the manipulator 136 can be moved in all three spatial directions—to be specific the x direction, the y direction and the z direction. Furthermore, an adjustment of the orientation of the manipulator tip 139 is possible by a turning and/or tilting of the manipulator 136.

The manipulator 136 is arranged in the receiving unit 131 in such a way in relation to a wall 140 of the receiving unit 131 that a gas flow channel 141 is formed between the manipulator 136 and the wall 140. Through this gas flow channel 141, gas can flow from the gas inlet 134 to the gas outlet 135.

The object 4 or part of the object 4 may for example be arranged at the manipulator tip 139. For example, material may be deposited by gas deposition on the surface of the object 4 in such a way that the manipulator tip 139 is connected to the part of the object 4. The part of the object 4 can then be lifted out from the object 4 and, for example, fastened to another object holder.

In the case of another embodiment, it is then provided that the manipulator 136 is not arranged with the positioning device 143 in the receiving unit 131. Rather, in the case of this embodiment it is provided that the manipulator 136 is arranged with the positioning device 143 outside the receiving unit 131. In particular, it is provided that the manipulator 136 is attached together with the positioning device 143 securely on gas feeding device 130 outside the gas flow channel 141, so that during the positioning of the gas feeding device 130 to a specific position on the surface of the object 4 the manipulator 136 continues to be moved at the same time to this position. The manipulator 136 with the positioning device 143 is in this case arranged for example approximately coaxially or coaxially in relation to the gas feeding device 130. In the case of this exemplary embodiment, it is provided that the gas that emerges from the gas outlet 135 only comes into contact with the manipulator tip 139 of the manipulator 136. Also in the case of this exemplary embodiment, accurate positioning of the manipulator 136 together with the manipulator tip 139 is performed with the positioning device 143.

The gas feeding device 130 combines the advantages of a manipulator and a gas feeding device in a single component. The gas is always fed to wherever it is desired. It is accordingly ensured that a sufficient amount of gas for allowing a deposition of material on the surface of the object 4 is always available. At the same time, the manipulator 136 can always be positioned sufficiently in such a way that it is arranged in the region of a location to be processed on the surface of the object 4.

The features of the invention that are disclosed in the present description, in the drawings and in the claims may be essential both individually and in any desired combinations for realizing the invention in its various embodiments. The invention is not restricted to the embodiments described. It can be varied within the scope of the claims and in consideration of the knowledge of a person skilled in the relevant art.

The invention claimed is:

1. A method for determining a distance of at least one component, which is located in a first starting position, of a particle beam device from an object, which is located in a second starting position, wherein the object is analyzed and/or processed by the particle beam device and wherein the component is formed as a gas feeding device, as a particle detector and/or as a beam detector, the particle beam device including at least one beam generator for generating a particle beam with charged particles, at least one objective lens for focusing the particle beam onto the object, and at least one vacuum region, in which the component is arranged, the method comprising:

moving the component from the first starting position of the component relatively in the direction of the object, which is located in the second starting position, until the component makes contact with the object; and when the component makes contact with the object, determining an adjusting path covered by the component and/or the object during the movement, the adjusting path running along a straight line that joins a first point on the component in the first starting position to a second point on the object in the second starting position that is arranged closest to the first point on the component along the straight line, the adjusting path corresponding to the distance.

2. The method as claimed in claim 1, wherein the component is movably formed and determining the adjusting path includes moving the component toward the object.

3. The method as claimed in claim 1, wherein the particle beam device has at least one movable object carrier for receiving the object and the determination of the adjusting path includes moving the object carrier toward the component.

4. A method for setting a position of at least one component of a particle beam device in relation to an object, wherein the object is analyzed and/or processed by the particle beam device and wherein the component is formed as a gas feeding device, as a particle detector and/or as a beam detector, the particle beam device including at least one beam generator for generating a particle beam with charged particles, at least one optical axis, along which the particle beam is guided, at least one objective lens for focusing the particle beam onto the object, and at least one vacuum region, in which the component is arranged, the method comprising:

setting a desired position of the component, wherein the component in the desired position is at a first object distance from the object, the first object distance being given by the length of a first line, which is aligned parallel to the optical axis or perpendicularly to a normal to the surface of the object, and wherein the first line joins a first point on the component to a second point on the object that is arranged closest to the first point on the component along the first line;

determining an actual position of the component by determining a second object distance, which is the distance at which the component is from the object in the actual position, wherein the determination of the second object distance includes moving the component from a first starting position of the component relatively in the direction of the object, which is located in a second starting position, until the component makes contact with the object and when the component makes contact with the object, determining an adjusting path covered by the component and/or the object during the movement, the adjusting path running along the first line and the adjusting path covered corresponding to the second object distance;

comparing the first object distance with the second object distance; and if the first object distance does not correspond to the second object distance, moving the component in relation to the object until the first object distance and the second object distance coincide.

5. The method as claimed in claim 4, wherein the component in the desired position is at a first axis distance from the optical axis, the first axis distance being given by the length of a second line, which is aligned perpendicularly to the optical axis and joins a third point on the optical axis to a fourth point on the component that is arranged closest to the third point on the optical axis, and wherein the component in the actual position is at a second axis distance, the second axis distance being given by the length of a third line, which is aligned perpendicularly to the optical axis and joins a fifth point on the optical axis to a sixth point on the component that is arranged closest to the fifth point on the optical axis, the method further comprising:

setting the desired position of the component by setting the first axis distance; and determining the actual position of the component by determining the second axis distance, comparing the first axis distance with the second axis distance; and, if the first axis distance does not correspond to the second axis distance, moving the component in relation to the object until the first axis distance and the second axis distance coincide.

6. The method as claimed in claim 5, wherein determining the second axis distance of the component from the optical axis includes guiding the particle beam over the object and onto the component, detecting interaction particles and/or interaction radiation by at least one detector, the interaction particles and/or the interaction radiation being generated by an interaction of the particle beam with the object and/or the component, generating detection signals by the detector and generating an image of the object and of the component using the detection signals, and measuring the second axis distance (A) by using the image.

7. A computer program product with a program code which can be loaded into a processor and which when executed determines a distance of at least one component, which is located in a first starting position, of a particle beam device from an object, which is located in a second starting position, wherein the object is analyzed and/or processed by the particle beam device and wherein the component is formed as a gas feeding device, as a particle detector and/or as a beam detector, the particle beam device including at least one beam generator for generating a particle beam with charged particles, at least one objective lens for focusing the particle beam onto the object, and at least one vacuum region, in which the component is arranged, the program code performing the following steps:

moving the component from the first starting position of the component relatively in the direction of the object, which is located in the second starting position, until the component makes contact with the object; and when the component makes contact with the object, determining an adjusting path covered by the component and/or the object during the movement, the adjusting path running along a straight line that joins a first point on the component in the first starting position to a second point on the object in the second starting position that is arranged closest to the first point on the component along the straight line, the adjusting path corresponding to the distance.

8. A particle beam device for analyzing and/or processing an object, comprising:

at least one beam generator for generating a particle beam with charged particles;

at least one optical axis, along which the particle beam can be guided;

at least one objective lens for focusing the particle beam onto the object;

at least one object carrier for arranging the object; and at least one vacuum region, in which a component of the particle beam device is arranged, wherein the component is formed as a gas feeding device, as a particle detector and/or as a beam detector, the object carrier and/or the component is/are adjustably formed, and wherein the particle beam device has at least one processor, in which a computer program product has been loaded, the program code performing the following steps:

setting a desired position of the component, wherein the component in the desired position is at a first object distance from the object, the first object distance being given by the length of a first line, which is aligned parallel to the optical axis or perpendicularly to a normal to the surface of the object, and wherein the first line joins a first point on the component to a second point on the object that is arranged closest to the first point on the component along the first line;

determining an actual position of the component by determining a second object distance, which is the distance at which the component is from the object in the actual position, wherein the determination of the second object distance includes moving the component from a first starting position of the component relatively in the direction of the object, which is located in a second starting position, until the component makes contact with the object and when the component makes contact with the object, determining an adjusting path covered by the component and/or the object during the movement, the adjusting path running along the first line and the adjusting path covered corresponding to the second object distance;

comparing the first object distance with the second object distance; and if the first object distance does not correspond to the second object distance, moving the component in relation to the object until the first object distance and the second object distance coincide.

9. The particle beam device as claimed in claim 8, wherein the object carrier is formed movably along at least one of the following axes, to be precise a first axis, a second axis and a third axis, and wherein at least two of the aforementioned axes are aligned perpendicularly to one another.

10. The particle beam device as claimed in claim 8, wherein the object carrier is formed rotatably about a first rotation axis and/or about a second rotation axis.

11. The particle beam device as claimed in claim 8, wherein the component is formed movably along at least one of the following axes, to be precise a first component axis, a second component axis and a third component axis, and wherein at least two of the aforementioned axes are aligned perpendicularly to one another.

12. The particle beam device as claimed in claim 8, wherein the component is formed rotatably about a first component rotation axis and/or about a second component rotation axis.

13. The particle beam device as claimed in claim 8, wherein the beam generator is formed as a first beam generator and the particle beam is formed as a first particle beam with first charged particles, wherein the optical axis is formed as a first optical axis, along which the first particle beam can be guided, wherein the objective lens is formed as a first objective lens for focusing the first particle beam onto the object, and wherein the particle beam device also has at least a second beam generator for generating a second particle beam with second charged particles, at least a second optical axis, along which the second particle beam can be guided, and at least a second objective lens for focusing the second particle beam onto the object.

14. The particle beam device as claimed in claim 8, wherein the particle beam device is an electron beam device and/or an ion beam device.

15. A gas feeding device for feeding at least one gas to an object, which can be analyzed and/or can be processed in a particle beam device having at least one beam generator for generating a particle beam with charged particles, at least one optical axis, along which the particle beam can be guided, at least one objective lens for focusing the particle beam onto the object, at least one object carrier for arranging the object, and at least one vacuum region, the gas feeding device comprising:

at least one gas inlet for letting the gas into the gas feeding device;

at least one gas outlet for letting the gas out of the gas feeding device; and at least one receiving unit, on which the gas inlet and/or the gas outlet is/are arranged, wherein a movably formed manipulator for the processing and/or arrangement of the object is arranged in the receiving unit.

16. The gas feeding device as claimed in claim 15, wherein the manipulator is arranged in the receiving unit in such a way in relation to a wall of the receiving unit that a gas flow channel is formed between the manipulator and the wall.

17. The gas feeding device as claimed in claim 15, wherein a positioning device for moving the manipulator is arranged on the gas feeding device, a longitudinal axis extends from the gas outlet to the positioning device, and wherein the manipulator is formed movably along the longitudinal axis.

18. The gas feeding device as claimed in claim 15, wherein the manipulator has at least one manipulator tip.

19. The gas feeding device as claimed in claim 15, wherein at least one sealing device is arranged on the receiving unit, and wherein the manipulator is arranged on the sealing device.

20. A computer program product with a program code which can be loaded into a processor and which when executed determines a distance of at least one component, which is located in a first starting position, of a particle beam device from an object, which is located in a second starting position, wherein the object is analyzed and/or processed by the particle beam device and wherein the component is formed as a gas feeding device, as a particle detector and/or as a beam detector, the particle beam device including at least one beam generator for generating a particle beam with charged particles, at least one objective lens for focusing the particle beam onto the object, and at least one vacuum region, in which the component is arranged, the program code performing the following steps:

setting a desired position of the component, wherein the component in the desired position is at a first object distance from the object, the first object distance being given by the length of a first line, which is aligned parallel to the optical axis or perpendicularly to a normal to the surface of the object, and wherein the first line joins a first point on the component to a second point on the object that is arranged closest to the first point on the component along the first line;

determining an actual position of the component by determining a second object distance, which is the distance at which the component is from the object in the actual position, wherein the determination of the second object distance includes moving the component from a first starting position of the component relatively in the direction of the object, which is located in a second starting position, until the component makes contact with the object and when the component makes contact with the object, determining an adjusting path covered by the component and/or the object during the movement, the adjusting path running along the first line and the adjusting path covered corresponding to the second object distance;

comparing the first object distance with the second object distance; and if the first object distance does not correspond to the second object distance, moving the component in relation to the object until the first object distance and the second object distance coincide.

21. A particle beam device for analyzing and/or processing an object, comprising:

at least one beam generator for generating a particle beam with charged particles;

at least one optical axis, along which the particle beam can be guided;

at least one objective lens for focusing the particle beam onto the object;

at least one object carrier for arranging the object; and at least one vacuum region, in which a component of the particle beam device is arranged, wherein the component is formed as a gas feeding device, as a particle detector and/or as a beam detector, the object carrier and/or the component is/are adjustably formed, and wherein the particle beam device has at least one processor, in which a computer program product has been loaded, the program code performing the following steps:

moving the component from the first starting position of the component relatively in the direction of the object, which is located in the second starting position, until the component makes contact with the object; and when the component makes contact with the object, determining an adjusting path covered by the component and/or the object during the movement, the adjusting path running along a straight line that joins a first point on the component in the first starting position to a second point on the object in the second starting position that is arranged closest to the first point on the component along the straight line, the adjusting path corresponding to the distance.

* * * * *